United States Patent [19]

Lai et al.

[11] Patent Number: 4,525,682

[45] Date of Patent: Jun. 25, 1985

[54] BIASED CURRENT MIRROR HAVING MINIMUM SWITCHING DELAY

[75] Inventors: Stephen H. Lai, Arlington Heights; Gopal K. Srivastava, Buffalo Grove, both of Ill.

[73] Assignee: Zenith Electronics Corporation, Glenview, Ill.

[21] Appl. No.: 577,904

[22] Filed: Feb. 7, 1984

[51] Int. Cl.³ .............................................. H03F 3/04
[52] U.S. Cl. .................................. 330/288; 330/296; 323/315
[58] Field of Search ....................... 330/257, 288, 296; 323/315, 316

[56] References Cited

U.S. PATENT DOCUMENTS 4,103,249 7/1978 Burdick .......................... 323/315 X
4,462,005 7/1984 Kusakabe et al. .................. 330/288

*Primary Examiner*—James B. Mullins
*Assistant Examiner*—Steven J. Mottola

[57] ABSTRACT

A biased current mirror comprises first and second transistor having their emitters connected to ground and their bases connected together. The collectors of the transistors are connected to connector pads on an integrated circuit. Bias current is supplied to the input of the current mirror to keep the base-emitter capacitances of the transistors charged despite a cutoff of input current. An offset current, proportional to the bias current is supplied to the output of the current mirror to offset the output current response of the mirror to the bias current. A current-capacitance oscillator including two biased current mirrors comprises differentially coupled pairs of transistors with the biased current mirrors controlling the charge and discharge of a timing capacitor. A conventional phase detector circuit incorporates a biased current mirror to minimize switching error due to delays associated with junction capacitors of the transistors.

6 Claims, 6 Drawing Figures

BIASED CURRENT MIRROR HAVING MINIMUM SWITCHING DELAY

BACKGROUND OF THE INVENTION AND PRIOR ART

This invention relates generally to current mirror circuits and particularly to an improved current mirror circuit having minimum delay.

Current mirrors are extensively used in integrated circuits when it is desired to have the current in one transistor circuit follow or "mirror" the current in another transistor circuit. As is well known, the output current in the second transistor will "follow" the input current in the first transistor, maintaining substantially the same amplitude ratio and differing only by the base-emitter bias currents of the two transistors. In a so-called improved current mirror circuit a bias transistor is added to supply the base-emitter currents of the two mirror transistors. The difference between the output current and the input current is thereby reduced by the h factor of the bias transistor, which is normally around 200 to 300. However, current mirror circuits are not often used in circuit applications where the input current is of a switching type and goes through zero transitions because of the inherent emitter-base capacitance of the transistors which must be charged before the base-emitter voltages will rise to permit current flow in the collector circuits. The effect is a delay wherein the output current lags the input current. Consequently current mirrors have been restricted to circuits in which the input currents do not go to zero on a regular basis, such as occurs in an oscillator or switching circuit.

On the other hand, current mirrors have been extensively used in environments where the input current may irregularly go to zero. The delay due to transistor emitter-base capacitance is compensated somewhat by increasing current flow, which decreases delay time because the emitter-base capacitance is charged more quickly with increased current flow. However, a larger current flow produce more heat which must be dissipated and is not a desirable solution. The use of larger currents than necessary simply burdens the design, especially in integrated circuits.

For oscillators and switching circuits, the delay manifests itself as a phase error. The delay is nearly constant for given operating conditions and imposes a low maximum frequency of operation on the circuit. Also, these errors are generally not controllable in that they are subject to substantial variation with component and circuit tolerances, manufacturing techniques and temperature. Thus there is a need in the art for a current mirror circuit that has minimum delay.

OBJECTS OF THE INVENTION

Accordingly, the principal object of the invention is to provide an improved current mirror circuit.

Another object of the invention is to provide a current mirror circuit with minimum delay.

A further object of the invention is to provide a current-capacitance oscillator circuit utilizing a current mirror.

A still further object of the invention is to provide an improved phase detector circuit utilizing a current mirror.

SUMMARY OF THE INVENTION

In accordance with the fundamental aspect of the invention, a transistorized current mirror having minimum delay includes an input and an output terminal, means supplying a bias current to the input terminal and means supplying an offset current to the output terminal for nullifying the effects of the bias current in the current mirror output.

BRIEF DESCRIPTION OF THE DRAWINGS

These and other objects of the invention will become apparent upon reading the following description in conjuction with the drawings in which.

DESCRIPTION OF THE PREFERRED EMBODIMENT

Figure 1:
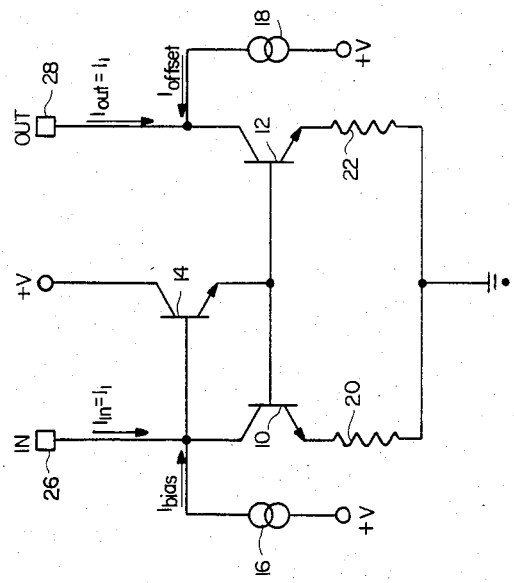
FIG. 1 represents a NPN version of a biased current mirror constructed in accordance with the invention.

Referring to FIG. 1, a biased current mirror in accordance with the invention is shown in an improved NPN current mirror circuit. A key aspect of the circuit is that a bias current is supplied to the input of the mirror and a corresponding offset current is added to the output of the mirror. More particularly, an input transistor 10 and an output transistor 12 have their base electrodes connected together and their emitter electrodes connected to ground through a resistor 20 and a resistor 22, respectively. These resistors are useful in compensating for any mismatch between transistors 10 and 12, as is well known. If the transistor base-emitter voltages were perfectly matched, these resistors would be unnecessary. The collector of transistor 10 is connected to a connection pad 26, labelled IN, and the collector of transistor 12 is connected to a connection pad 28, labelled OUT. The connection pads are commonly used in integrated circuitry for enabling connection between elements inside the chip and elements outside the chip. A bias supply transistor 14 has its base electrode connected to the collector of transistor 10, its emitter electrode connected to the bases of transistors 10 and 12 and its collector electrode connected to a $+V$ potential source. This arrangement will be recognized as an improved current mirror in which transistor 14 supplies bias current for transistors 10 and 12 and, because of its $h_{fe}$, contributes to the near equality between the input current and the output current of the mirror.

A current source 16 is connected from $+V$ to the collector of transistor 10 and supplies an input current, labeled I bias, which represents the bias current required by transistor 14. A similar current I offset, is supplied from another current source 18 to the collector of output transistor 12. The addition of I bias to the input current, I in, has no effect on the output current, I out, of the mirror because of I offset supplied to transistor 12. This follows from the relationship that specifies I in+I bias=I out+I offset. If I bias=I offset, then I in=I out. However, the current I bias is sufficient to keep the emitter-base junction capacitances of transistors 10 and 12 charged and to thus minimize the time to raise the base voltages of these transistors above conduction. That is, despite the current I in being zero, the current I bias from source 16 continues to supply the needed bias current to keep the emitter-base junction capacitances of transistors 10 and 12 charged. The current I bias would normally be reflected in a similar current in the output of the current mirror. However the introduction of the current I offset=I bias from current source 18 to the collector of transistor 12 results in the output current amplitude tracking the input current and being zero when the current Iin is zero. Thus, the circuitry outside of the current mirror is unaffected. The result is that with the biased current mirror of the invention, the delay of the current mirror is minimized.

In the illustrated circuit, the current I in=I out. That is there is a unity relationship between input and output currents of the mirror. Those skilled in the art will readily perceive that for a current mirror where In=KI out, that I bias=KI offset.

Figure 2:
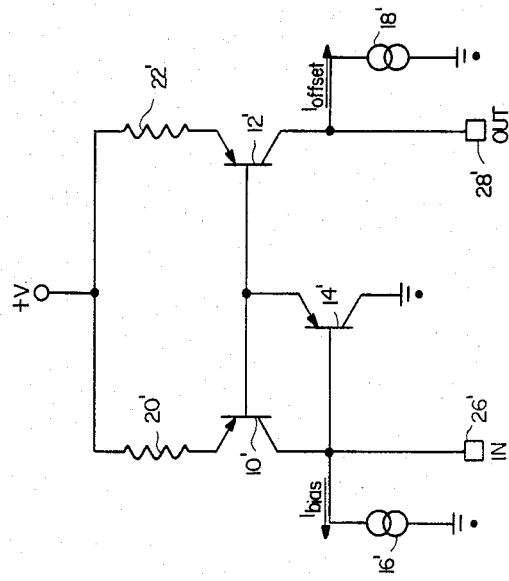
FIG. 2 represents a PNP version of the circuit of FIG. 1.

In FIG. 2 a PNP version of the circuit of FIG. 1 is shown. The circuit operates in the same manner with corresponding elements bearing similar reference characters. Thus transistor 10 corresponds to transistor 10', transistor 12 to transistor 12', etc. The operation of the FIG. 2 embodiment is believed to be self-evident in view of the description of FIG. 1.

Figure 3:
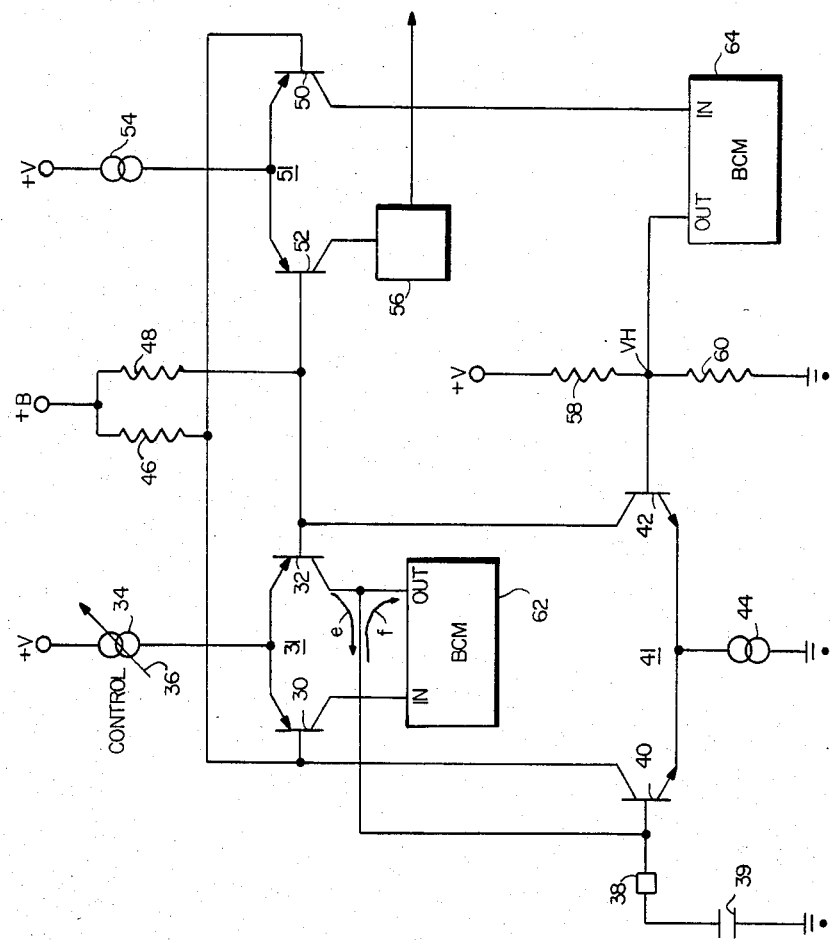
FIG. 3 is a schematic diagram of a current capacitance oscillator incorporating biased current mirrors.

In FIG. 3 a current-capacitance oscillator is disclosed using two biased current mirrors of the invention. In general a current-capacitance oscillator is similar to an R-C oscillator. Both oscillator types are less stable than an L-C oscillator with respect to temperature, supply voltage and component tolerances. Yet the linearity of the current-capacitance oscillator, due to its constant charge and discharge currents and its obvious cost advantages over an L-C oscillator make it very attractive provided the problems of switching delays are overcome. The biased current mirror of the invention minimizes such switching delays and makes the integrated circuit current-capacitance oscillator eminently suitable for commercial use.

The oscillator includes a first differentially coupled transistor pair 31 consisting of transistors 30 and 32 having their collectors connected to the input and output terminals, respectively, of a biased current mirror 62 and their emitters connected, through a controllable constant current source 34, to +V voltage. A control arrow 36 indicates that the current available from constant current source 34 is variable as a function of a control voltage from other well-known circuitry (not shown) for adjusting the oscillator frequency. A similar differentially coupled transistor pair 51, consisting of transistors 50 and 52, is coupled in parallel with pair 31, with the base of transistor 50 being connected to the base of transistor 30 and the base of transistor 52 being connected to the base of transistor 32. The emitters of transistors 50 and 52 are connected through a constant current source 54 to +V. The commonly connected bases of the transistor pairs are individually connected to A+B voltage source through resistors 46 and 48. The collector of transistor 52 is connected to a block 56, which may be any well known current-to-voltage device, such as an inverter, the output of which represents the output of the oscillator.

The base of transistor 30 is also connected to the collector of a transistor 40 which, in conjunction with a transistor 42, forms a differentially coupled transistor pair 41. The collector of transistor 42 is connected to the base of transistor 32. The emitters of transistors 40 and 42 are connected through a current source 44 to ground. The output of biased current mirror 62 is connected to the base of transistor 40 and, through a connector pad 38, to a timing capacitor 39 connected to ground. The base of transistor 42 is connected to a voltage divider consisting of resistors 58 and 60 connected in series between +V and ground. The junction of the voltage divider is labelled VH and is connected to the output of another biased current mirror 64, the input of which is returned to the collector of transistor 50. As indicated by connector pad 38, all of the circuit elements except timing capacitor 39 may be incorporated within an integrated circuit. The biased current mirror blocks 62 and 64 will be understood to take the form of the current mirror disclosed in FIG. 1.

Figure 4:
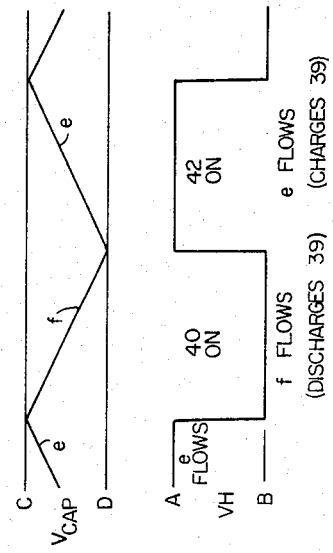
FIG. 4 illustrates waveforms showing the charging and discharging of the timing capacitor of the oscillator of FIG. 3.

Reference to FIG. 4 discloses a pair of curves indicating the voltage on timing capacitor 39 with respect to the change in voltage at junction point VH on the voltage divider. As in all oscillator circuits, the description is simplified by assuming the circuit is operating. As VH is caused to swing from voltage A to voltage B, the voltage across capacitor 39 changes linearly from voltage C to voltage D. Assume that the voltage across timing capacitor 39 is approaching C and that charging current "e" is flowing into the capacitor from the collector of conducting transistor 32. Transistors 32, 42 and 52 operate together, as do transistors 30, 40 and 50. Transistor 42 is thus conducting as is transistor 52. Transistor 40 begins to conduct since its base is at voltage C which is approximately equal to voltage A. In so doing, it reduces the base voltage on transistor 30, which causes transistor 30 to begin conducting. Since the base of transistor 30 and the base of transistor 50 are connected together, transistor 50 also begins conducting. The collector current of transistor 50 flows into the input of biased current mirror 64. The matching output current of the mirror 64 is supplied by the voltage divider and the result is that the potential at point VH decreases, thus tending to further cut off transistor 42 and switch conduction to transistor 40. Transistor 50 also follows transistor 30 and the operation is cumulative with transistors 30, 40 and 50 turning on and transistors 32, 42 and 52 switching off, causing a very rapid transition in conduction between the transistor group and causing VH to go from voltage A to voltage B. It will be appreciated that during the charging cycle, timing capacitor 39 receives a linear current along the charge path indicated by "e". VH drops very rapidly in voltage from A to B, as indicated, when transistor 40 turns on and transistor 42 is cut off because its base voltage, which is supplied from point VH, is low, and thus transistors 32 and 52 are cut off. The switching transition is complete when transistors 30, 40 and 50 are fully conductive.

Capacitor 39 now begins to discharge, as indicated by the arrow "f", into biased current mirror 62 to match the input current to the biased current mirror resulting from conduction of transistor 30. The capacitor continues discharging until its voltage reaches D which is approximately equal to voltage B. At this point, transistor 40 is still on and transistor 42 begins to conduct, followed by its companion transistors 32 and 52. When transistor 52 starts to conduct, it reduces conduction of transistor 50 which in turn reduces the output current of biased current mirror 64 causing the voltage of point VH to rise and turn transistor 42 on harder, culminating in a rapid transition in the opposite direction. The collector of transistor 52 reflects these switching voltages and the output from inverter 56 is the oscillator output voltage. The frequency is controlled by a change in the current source 34, as mentioned.

Figure 5:
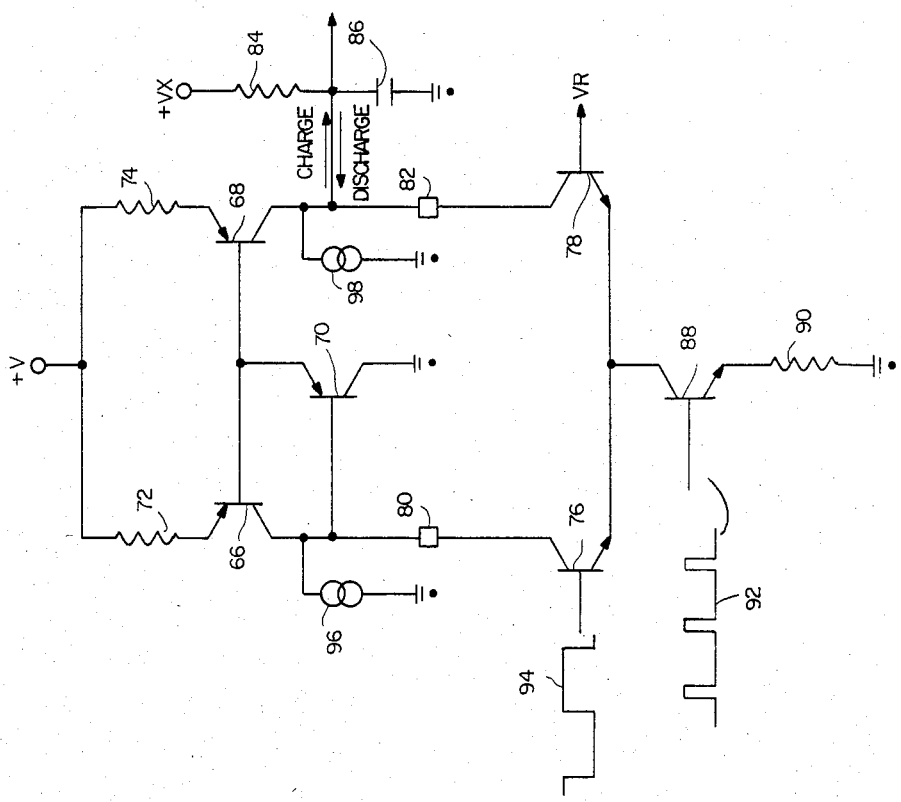
FIG. 5 is a schematic diagram of a phase detector using the biased current mirror of the invention.

The phase detector circuit in FIG. 5 is conventional with the exception of the bias current and the offset current which are added to the biased current mirror input and output, respectively. The current mirror comprises transistors 66 and 68 having their base electrodes connected to the emitter of transistor 70. The emitters of transistors 66 and 68 are connected to a source of +V potential through matching resistors 72 and 74, respectively. The base of transistor 70 is connected to the collector of transistor 66 and its collector is connected to ground. Transistor 70 is seen to yield the improved current mirror configuration illustrated in FIG. 2. The collectors of transistors 66 and 68 are connected to two connector pads 80 and 82, respectively and to the collectors of a differentially coupled transistor pair 77 comprising transistors 76 and 78. These transistors have their emitters connected to the collector of a switching transistor 88, the emitter of which is connected to ground through a resistor 90. The base of switching transistor 88 is supplied with a pulse signal 92. The base of transistor 76 is suppled with a signal 94 to be phase compared with pulse signal 92, and the base of transistor 78 is connected to a DC voltage reference VR. A phase error capacitor 86 has one terminal connected to +VX through a resistor 84 and the other terminal connected to ground. The junction of capacitor 86 and resistor 84 is connected to the junction of the collectors of transistors 68 and 78, and is the source of the error signal resulting from the comparison of the phases of signals 92 and 94. The biased current mirror arrangement is completed by current sources 96 and 98 coupled between ground and the collectors of transistors 66 and 68, respectively.

Figure 6:
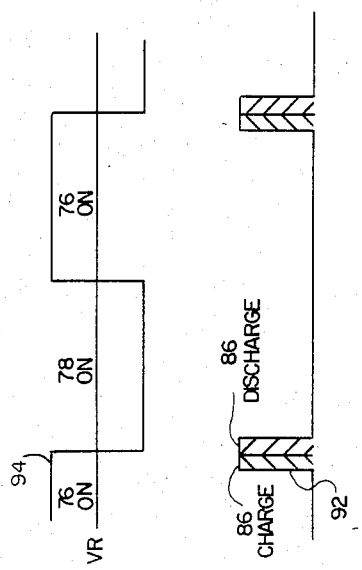
FIG. 6 shows waveforms illustrating the charge and discharge of the output capacitor of the FIG. 5 phase detector.

As shown in FIG. 6, signal 94 will result in corresponding conduction and cutoff of transistors 76 and 78 during the occurrence of the positive portion of pulse signal 92. When transistor 76 is conducting, capacitor 86 charges and when transistor 78 is conducting, capacitor 86 discharges. The phase of signal 92 with respect to signal 94 determines the length of the charge and discharge periods. Hence, the voltage developed across capacitor 86 is representative of the phase error between the signals. It will be appreciated that a delay in the current mirror would result in an error voltage even though there was no phase difference between the signals. This error would be uncontrollable because of the factors mentioned earlier, such as temperature. The phase detector circuit incorporating the biased current mirror of the invention minimized any such error because of the minimized delay in the current mirror transistors.

What has been described is a novel biased current mirror with minimum delay, and a current-capacitance oscillator and phase detector incorporating the same. It is recognized that numerous modifications and changes in the described embodiments of the invention will be apparent to those skilled in the art without departing from the true spirit and scope thereof. The invention is to be limited only as defined in the claims.

What is claimed is:

1. A transistorized current mirror having minimum delay comprising:
   an input terminal for receiving an input signal;
   an output terminal;
   current mirror means for developing a current in the output terminal mirroring the current supplied to the input terminal;
   means supplying a bias current to said input terminal; and
   means supplying an offset current to said output terminal to nullify the effects of said bias current in the output of said current mirror.

2. The current mirror of claim 1 further including:
   a first transistor connected to said input terminal;
   a second transistor connected to said output terminal; and wherein said bias current charges the base-emitter junction capacitances of said transistors.

3. The current mirror of claim 2 further including a third transistor for supplying bias current to said first and to said second transistors, said bias current supply means supplying bias current to said third transistor.

4. The current mirror of claim 3 wherein said bias current supply means and said offset current supply means are both constant current sources.

5. A current mirror having minimum delay comprising:
   an input terminal for receiving an input signal and an output terminal;
   a first transistor and a second transistor coupled in a current mirror configuration, with said first transistor being coupled to said input terminal and said second transistor being coupled to said output terminal;
   a first current source supplying a bias current to said input terminal; and
   a second current source supplying an offset current to said output terminal for nullifying the effects of said bias current in the output of said current mirror.

6. The current mirror of claim 5 further including a third transistor coupled to said first current source for receiving bias current therefrom and for supplying bias currents to said first and to said second transistors.

* * * * *